(12) United States Patent
Klare et al.

(10) Patent No.: US 7,232,646 B2
(45) Date of Patent: Jun. 19, 2007

(54) LOW-VISCOUS, RADIATION CURABLE FORMULATION, PARTICULARLY FOR THE STEREO-LITHOGRAPHICAL PRODUCTION OF EARPIECE

(75) Inventors: Martin Klare, Dortmund (DE); Reiner Altmann, Castor-Rauxel (DE); Michael Kutschinski, Castor-Rauxel (DE); Georgia Meissner, Dortmund (DE); Thomas Veit, Münster (DE)

(73) Assignee: Dreve-Otoplastik GmbH, Unna (DE)

( * ) Notice: Subject to any disclaimer, the term of this patent is extended or adjusted under 35 U.S.C. 154(b) by 0 days.

(21) Appl. No.: 10/561,651

(22) PCT Filed: Jun. 17, 2004

(86) PCT No.: PCT/DE2004/001262

§ 371 (c)(1),
(2), (4) Date: Dec. 19, 2005

(87) PCT Pub. No.: WO2005/001570

PCT Pub. Date: Jan. 6, 2005

(65) Prior Publication Data

US 2006/0264526 A1 Nov. 23, 2006

(30) Foreign Application Priority Data

Jun. 23, 2003 (DE) ................. 103 28 302

(51) Int. Cl.
*G03F 7/00* (2006.01)
*B29C 67/00* (2006.01)

(52) U.S. Cl. ................ 430/285.1; 430/284.1; 430/917; 522/16

(58) Field of Classification Search ............ None
See application file for complete search history.

(56) References Cited

U.S. PATENT DOCUMENTS

| 5,354,785 A | * | 10/1994 | Rheinberger et al. | ....... 523/116 |
| 5,969,000 A | * | 10/1999 | Yang et al. | ................. 523/116 |
| 6,025,114 A | * | 2/2000 | Popat et al. | ............. 430/284.1 |
| 2002/0152930 A1 | * | 10/2002 | Neubert et al. | ............... 106/35 |

FOREIGN PATENT DOCUMENTS

JP 2002-302523 A * 10/2002

OTHER PUBLICATIONS

Sartomer Application Bulletin "Chemical Intermediates—Design Unique Polymers with Sartomer's Specialty Monomers" dates Dec. 2004, 4 pages, from TOTAL, Sartomer Company.*

* cited by examiner

*Primary Examiner*—Cynthia Hamilton
(74) *Attorney, Agent, or Firm*—Andrew Wilford; Jonathan Myers

(57) ABSTRACT

The invention relates to a biocompatible, low-viscous, radiation curable formulation, particularly for use in stereolithography, for use in medical technology, in particular, for producing earpieces, containing: a) 55-95% by weight of a monomeric or oligomeric dimethacrylate based on bisphenol A or bisphenol F; b) 0-20% by weight of a urethane methacrylate having a functionality of n<4 and a viscosity<15 Pa s; c) 2-15% by weight of a monomeric aliphatic or cycloaliphatic dimethacrylate having a viscosity<5 Pa s; d) 0-15% by weight of a monofunctional methacrylate having a viscosity<3 Pa s; e) 0.5-6% by weight of a photoinitiator or a combination of a number of photoinitiators whose absorption is located within the wavelength range of the laser beam used; f) 0.0001-2% by weight of the inhibitor 2,2,6,6-tetramethylpiperidin-1-yloxy (free radical), also in conjunction with known inhibitors; g) 0-40% by weight of fillers; h) 0-5% by weight of coloring pigments; i) 0-5% by weight of remaining additives such as UV stabilizers or spreading additives, whereby the proportions of constituents a) to h) total 100% by weight.

2 Claims, 2 Drawing Sheets

Figure 1:
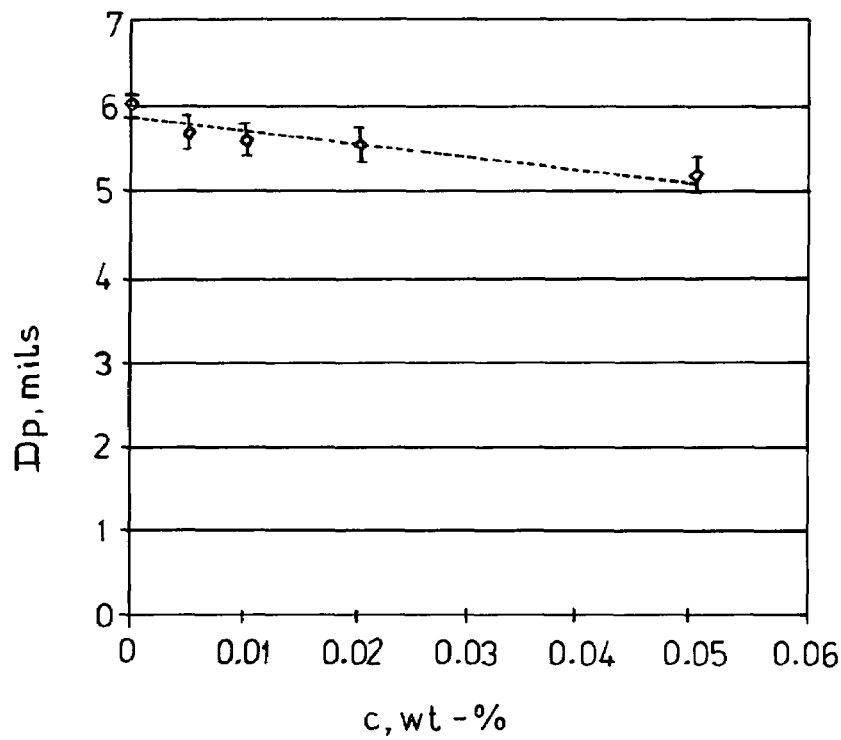

LOW-VISCOUS, RADIATION CURABLE FORMULATION, PARTICULARLY FOR THE STEREO-LITHOGRAPHICAL PRODUCTION OF EARPIECE

The present invention relates to a low viscosity, radiation curable formulation, especially for the stereolithographic production of products suitable for medicinal technology, especially for the production of earpieces, on a basis of at least two compounds which have radical-polymerizable methacrylate functions radial and at least one photo initiator suitable for the polymerization of the respective compounds and at least one source of an inhibitor in the form of the 2,2,6,6-tetramethylpiperidine-1-yloxy (free radical) suitable for stabilizing the stereolithographic resin and which apart from other inhibitors already known in the art of stereolithographic resins has been found to be suitable as a highly advantageous formulation component for such compositions.

From U.S. Pat. No. 4,575,330, it is known that low viscosity, radiation curable resins or resin mixtures can be used for the production of three dimensional objects by means of stereolithography.

Further, it is known from U.S. Pat. No. 5,487,012 and WP 01/87001 that the stereolithograpy can be advantageously employed for producing earpieces. In the stereolithographic process, three dimensional objects are formed from a low viscosity, radiation curable formulation in that a thin layer of the formulation (about 0.0025 to 0.01 mm in thickness) of the formulation can be so prehardened by actinic radiation in a defined manner that the layer produced has the desired cross sectional shape of the object at the particular location. At the same time, the layer produced in the hardening step is polymerized. The configuration of the object can be defined with the aid of a computer controlled laser system utilizing for example a Nd:YVO solid body laser (Viper Si$^2$ SLA System as manufactured by the U.S. Firm 3D Systems). The shaped bodies thus generated can optionally be after-hardened, for example, by radiation curing.

In the stereolithographic process, resin formations are used which satisfy special requirements. Thus mention can be made especially of the radiation sensitivity and the viscosity of the resin formulation as well as the hardness of the shaped body prehardened by means of laser hardening. This incompletely hardened shaped body is referred to in the stereolithographic arts as a green body and the hardness of this green body is characterized by its modulus of elasticity (E-modulus) and its bending strength, referred to as the green strength of the body.

The green strength is an important parameter in stereolithographic practice since a shaped body with low green strength can deform during the stereolithographic process under its own weight or during the after-hardening under a xexon arc lamp or halogen lamp can sag or deform. It will thus be understood that because of the aforedescribed requirements, complicated formulations and compositions have been developed.

For example, H. Kodama in Rev. Sci. Instrum. 52 (11), 1170-1173 (1981) has described a low viscosity radiator curable formulation comprised of an unsaturated polyester, an acrylic acid esterstyrene and a polymerization initiator. From the view of the use of stereolithographic techniques, however, this resin formulation has a low green strength and an insufficient photosensitivity.

Also having an insufficient photosensitivity from the view point of production technology are the resin formulations disclosed in U.S. Pat. No. 4,100,141. A low photosensitivity means that long exposure periods and durations of manufacture are required for making the shaped body. Correspondingly, the photosensitivity of the stereolithographic resin formulation must be so set that from the ratio of the penetration depth of the laser beam into the low viscosity radiation curable resolution and the radiation energy that is provided, that with low radiation energy, the greatest possibly curing depth and simultaneously the highest degree of polymerization can be realized to achieve a good green strength and sufficient stability of the resin. formulation by contrast with auto polymerization. Liquid, radiation curable resin formulations that can satisfy the above-mentioned requirements partly are described for example in U.S. Pat. No. 5,476,748 or WO 99/50711. These formulations which can be referred to as a "hybrid system" contain a combination of radical polymerizable and cationically polymerizable components. They comprise, firstly, a liquid difunctional or polyfunctional epoxy component or a mixture of difunctional or higher functional epoxy components;

secondly, they comprise a cationic photo initiator or a mixture of cationic photo initiators;

thirdly, they comprise a photoinitiator or a mixture of photo initiators for the free radical polymerization and at least one low viscosity poly(meth)acrylate with a (meth) acrylate functionality of n>2, at least one diacrylate and a polyol component of the group of hydroxyl terminated polyethers, polyesters and polyurethanes.

The artisan is aware that such formulations from the point of view of toxicology may not be suitable for the production of medicinal products or can be used only in a limited way for the production of products used in medicine. For example, it is known that cationic photo initiators can give rise to skin irritation and allergic reactions. Similarly, compounds with epoxide functions in such formulations may be toxic. The skilled worker in the art is also aware that acrylate compounds also have an increased potential to cause allergic reactions and thus, for example, those which have been described in EP 0 425 441, EP 0 914 242 and EP 0 579 503, because of biocompatibility problems cannot be used for the production of earpieces. For use in medicinal technology, monomeric or oligomeric dimethacrylates on the basis of bisphenol-A or bisphenol-F and urethane methacrylate with a functionality of n≧2 have been found to be effective. By comparison to the acrylate compound group, the methacrylate compound group however has a reduced reactivity for the stereolithographic technique. As a consequence, the above described drawbacks with respect to penetration depth of the laser beam and green strength of the prehardened objects can result. Because of the reduced reactivity of this class of compounds, it is necessary, further, to use higher concentrations of one or more photo initiators for the free radical polymerization. This gives rise to a reduced stability against autopolymerization of the resin composition.

The skilled worker in the art is also aware that in the stereolithographic technique for the production of a large number of small objects of limited mass, an increased mechanical and thermal loading of the stereolithographic resin formulation can arise which can lead to an auto polymerization of the. stereolithographic resin or to a variation in the characteristics of the resin composition and the shaped bodies to be produced therefrom.

With a reduced resin consumption, the prehardened shaped bodies which are fixed on a plate from must be removed relatively frequently from the stereolithographic unit. As a result, temperature fluctuations arise in the stereolithographic resin in the apparatus chamber. Moreover, in the production of earpieces, the shaped bodies which are produced have a relatively large surface area to volume ratio. The skilled worked knows that the free radical polymerization can produce an inhibition layer on the surface of the shaped body as a result of oxygen entry. The resin which is only polymerized incompletely or is unpolymerized can thus release during the shaping process from the surface of the sample holder for the stereolithographic resin.

For these reasons the stabilization of the low viscosity radiation curable resin composition is a significant parameter in the production of earpieces with the stereolithographic technique from the point of view of production technology. It is therefore desirable that the laser beam have a penetration depth that is as constant as possible for the critical energy for the stereolithographic formulation.

The object of the present invention is to make available a stereolithographic resin formulation for the production of medicinal products, especially earpieces, which will satisfy the mechanical, toxicological and rapid manufacturing requirements for stereolithography.

It has been found that a low viscosity resin mixture of one or more mutually different monomeric or oligomeric dimethacrylates on the basis of bisphenol A or bisphenol F and that, in addition, contains a urethane methacrylate of a functionality of n<4 and a viscosity <10 Pa s and, in addition, a monomeric aliphatic or cycloaliphatic dimethacrylate with a viscosity of <3 Pa s and 2,2,6,6-tetramethylpiperidine-1-yloxy (free radical) can be used for stereolithographic techniques and will yield upon curing a shaped body prehardened or procured by means of laser which has a high green strength. Surprisingly, it has been found further that stereolithographic resin formulations of low viscosity and which are radiation curable can be produced containing the inhibitor 2,2,6,6-tetramethyl piperidine-1-yloxy (free radical) with a ratio of the critical energy to penetration depth that can be set within a wide range. The shaped body resulting from full curing or full hardening has apart from good mechanical properties, excellent biocompatibility, is hard elastic and can be after treated by, for example, grinding or painting or lacquering.

The subject of the present invention is, therefore, a low viscosity radiation curable stereolithographic resin containing (a) 55 to 95. weight percent of a monomeric or oligomeric dimethacrylate on the basis bisphenol A or bisphenol F;

(b) 0 to 20 weight percent of a urethane methacrylate with a functionality n<4 and a viscosity <10 Pa s;

(c) 2 to 15 weight percent of a monomeric aliphatic or cycloaliphatic diacrylate with a viscosity <3 Pa s;

(d) 0 to 15 weight percent of a monofunctional methacrylate with a viscosity <3 Pa s;

(e) 0.5 to 6 weight percent of one or photoinhibitor a combination of a number of photo initiators whose absorption lies in the wavelength range of the laser beam used;

(f) 0.0001 to 2 weight percent of the inhibitor 2,2,6,6-tetramethylpiperidine-1-yloxy (free radical) alone or in combination with inhibitors known in the art;

(g) 0 to 40 weight percent of fillers; 15 (h) 0 to 5% weight percent of pigments or coloring agents; and (i) 0 to 5 weight percent of the usual additives like UV stabilizers or flow additives whereby the proportion of the components (a) through (h) together amounts to 100 weight percent.

Preferably, the mixture according to the invention contains:

(a) 60 to 90% by weight or an n-fold ethoxylated bisphenol A dimethacrylate with a degree of ethoxylation of n<10 or a mixture of n-fold ethoxylated bisphenol A dimethacrylates with a degree of esterylation of n<10;

(b) 5 to 17% by weight of an aliphatic or cycloaliphatic urethane methacrylate with a functionality of n<4 and a viscosity of <10 Pa s;

(c) 3 to 10% by weight of a monomeric aliphatic or cycloaliphatic dimethacrylates with a viscosity of <3 Pa s;

(d) 2 to 10% by weight of a monofunctional methacrylate with a viscosity <3 Pa s;

(e) 1 to 4% by weight of a photoinitiator or a combination of a plurality of photo initiator whose absorption lies in the wavelength region in which the laser beam used lies;

(f) 0.005 to 0.05% by weight of the initiator 2,2,6,6-tetramethylpiperidine-1-yloxy (free radical) which may be in combination with the inhibitors known in the art of stereolithography;

(g) 0 to 20% by weight of fillers;

(h) 0 to 5% by weight of coloring agents or pigments; and (i) 0.01 to 3% by weight of the usual additives like UV stabilizers or flow additives, whereby the proportion of the components (a) to (h) together make up 100 weight percent.

The suitable compounds of the component (a) are, for example, the dimethacrylates of (n)-alkoxylated bisphenol-A like bisphenol-A-ethoxylate(2)dimethacrylate, bisphenol-A-ethoxylate(4) dimethacrylate, bisphenol-A-propoxylate(2)dimethacrylate, bisphenol-A-propoxylate-(4)-dimethacrylates, as well as dimethacrylates of the (n)-alkoxylated bisphenol-F like bisphenol-F-ethoxylate(2)-dimethacrylate, bisphenol-F-ethoxylate(4)dimethacrylate, bisphenol-F-propxylate(2), dimethacrylate, bisphenol-F-propoxylate(4)dimethacrylate, and mixtures thereof. Preferably one uses monomeric or oligomeric dimethacrylates of a bisphenol-A basis and especially the bisphenol-A-ethoxylate(2)dimethacrylate and the bisphenol-A(4)dimethacrylate. Especially preferred are mixtures of these two dimethacrylate on a bisphenol-A basis with a proportion of the bisphenol-A ethoxylate(4)dimethacrylate>than that of the bisphenol-A-ethoxylate(2)dimethacrylate.

The urethane methacrylates used in the formulation according to the invention as component (b) with a functionality<4 are known to the skilled worker in the art and can be produced in a known manner by reacting for example a hydroxyl terminated polyurethane with methacrylic acid to the corresponding urethane methacrylate or by reacting an isocyanate prepolymer with hydroxy methacrylates. Corresponding methods are known for example from EP 0 579 503. Urethane methacrylates are also available commercially and are marketed for example under the designation PC-Cure® by the Firm Piccadilly Chemicals, under the product designation CN 1963 by the Firm Sartomer and under the designation Genomer® by the Firm Rahn.

Preferably the urethane methacrylate which is used which has a functionality of n<4 and is produced from aliphatic educts, are especially the HEMA and TMDI containing isomer mixture 7,7,9-(or 7,9,9-)trimethyl-4,13-dioxo-3,14-dioxa-5,12-diazahexadecane-1,16-diol-dimethacrylate.

Examples of the compounds of component (c) are: 1,3-butanedioldimethacrylate, 1,6-hexanedioldimethacrylate, 1,3-butleneglycoldimethacrylate, diethyleneglycoldimethacrylate, ethyleneglycoldimethacrylate, neopentyldimethacrylate. polyethyleneglycoldimethacrylate, triethyleneglycoldimethacrylate and tetraethyleneglycoldimethacrylate and preferably 1,4-butanedioldimethacrylate. Such products are commercially available and can be obtained, for example from the Firm Sartomer.

The component (d) of the formulation according to the invention can for example include the following compounds:

allylmethacrylate; methyl-, ethyl, n-propyl, n-butyl, isobutyl, n-hexyl, 2-ethylhexyl, n-octyl, n-decyl, n-dodecyl, isobornyl, isodecyl, lauryl- and stearylmethacrylate: 2-Hydroxyethyl-, 2- and 3-hydroxypropylmethacrylate; tetrahydrafurfurylmethacrylate and cyclohexylmethacrylate. Especially preferred is the ethylmethacrylate.

As the component (e) photo inhibitors or all types can be used which form free radicals with corresponding irradiation, these include known photoinitiator compounds including benzoins, benzoinethers, like benzoine, benzoinmethether, benzoinethylether, benzoineisopropylether, benzoinephenylether and benzoineacetate, acetophenones like acetophenones, 2,2-dimethoxy acetophenone and 1,1 dichlor acetophenone, benzil, benzylketals like benzyldimethylketal and diethylketal, anthraquinones, like 2-methylanthraquinone, 2-ethylanthraquinone, 2-tertiarybutylanthraquinones, 1-chlorobutylanthraquinones, 2-amylanthraquinones, triphenylphosphine, benzoylephosphino like, for example, 2,4,6-Trimethylbenzoyldiphenylphosphinoxide (LUZIRIN TPO) and bis(2,4,6-trimethylbenzoylphenylphosphinoxide, benzophenones, like benzophenone and 4,4'-bis(n,n'-diethylamine)-benzophinone, thioxanthone and xanthone, acridine derivatives, phenazine derivatives, quinoxaline derivatives or 1-phenyl-1,2-propanedione-2-0-benzoyloxime, 1-aminophenylketone or 1-hydroxyphenylketone or 1-hydroxycyclohexylphenyl ketone, phenyl 1-hydroxyisopropyl)ketone and isoproplophenyl-(1-hydroxyisopropyl)-ketone.

Especially preferred compounds which can be used in combination with a Nd:YVO$_4$ solid body laser, are bis-(2,4,6,-trimethylbenzoyl)-phenylphosphineoxide 2,4,6-trimethylbenzoyl-diphenylphosphinoxide, 2-hydroxy-2-methylpropiophenone, hydroxy cyclohexyl phenyl ketone and mixtures of these photo initiators.

Figure 2:
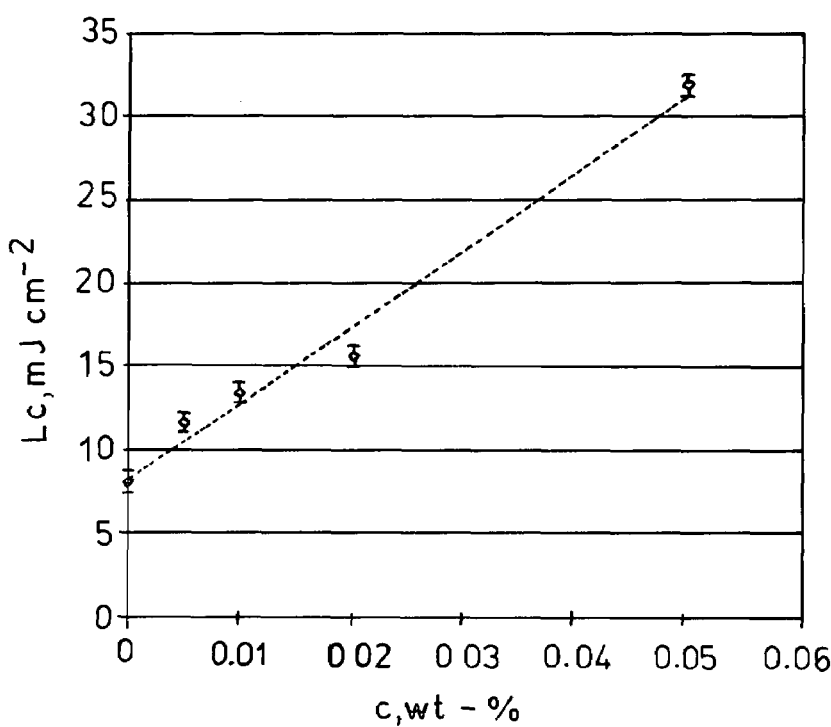
Figure 3:
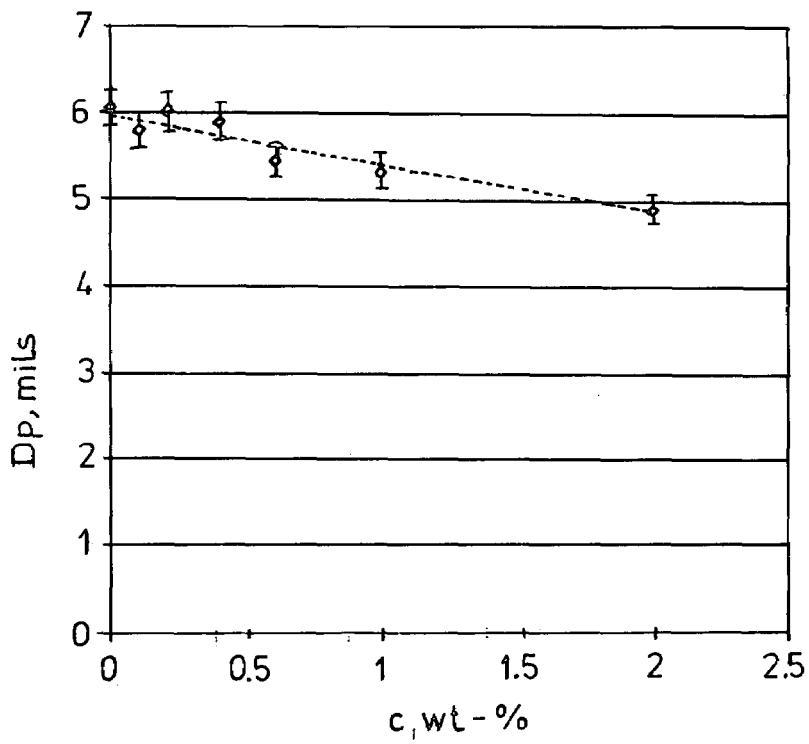
Figure 4:
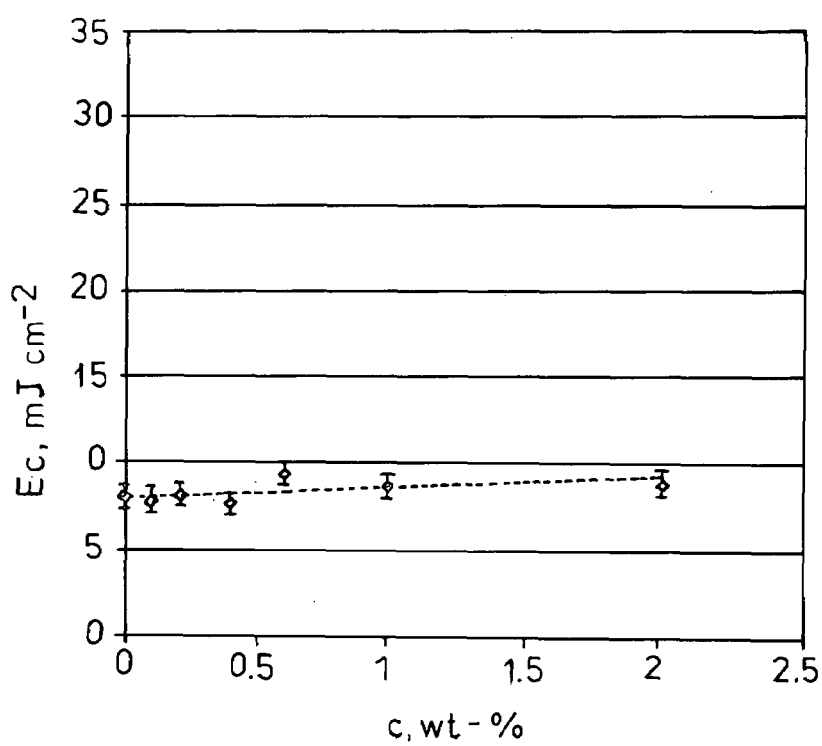

Into the mixture according to the invention, 2,2,6,6-tetramethylpiperdine-1-yloxy (free radical) is added. The influence of the concentration of the 2,2,6,6-tetramethylpiperdine-1-yloxy (free radical) in the exemplary formalation 1 upon the penetration depth of the laser beam and energy has been shown in FIGS. 1 and 2. The laser penetration depth and the critical energy are determined by means of the window pane method described by P. F. Jacobs and D. R. Read in Rapid Prototyping and Manufacturing of the Society of Manufacturing Engineers, Dearborn, Mich. (1992), 1$^{st}$, ed., pgs. 263-280. From the figures, it will be apparent that even limited addition of the 2,2,6,6-tetramethylpiperdine-1-yloxy (free radical) gives rise to a surprising increase in the critical energy with only a limited change in the penetration depth of the laser beam. This influence of the inhibitor 2,2,6,6-tetramethylpiperdine-1-yloxy (free radical) upon the relevant parameters Ec (critical energy in mJ cm$^{-2}$) and Dp (laser penetration depth in mils) of the stereolithographic resin, the effect differing from the influence of the inhibitors like, for example, hydroquinone-monomethylether which are added to stereolithographic resins in accordance with the state of the art. The influence of the hydroquinonemonomethylether on the parameters Ec and Dp in the exemplary formulations 2 is shown in FIGS. 3 and 4.

By comparison with the effect of the 2,2,6,6-tetramethylpiperdine-1-yloxy (free radical) the critical energy of the stereolithographic resin can only be adjusted by significantly higher concentrations of hydroauinonemonomethylether within a significantly smaller frame. Moreover, the effect of the hydroquinonemonoether methyl inhibitor upon the laser penetration depth is greater than in the case of the use of the 2,2,6,6-tetramethyl piperdine-1-yloxy (free radical). This is especially disadvantageous when the parameters of colored or opaque stereolithographic resins must be adjusted since the addition of pigments or coloring agents also reduce the laser penetration depth. The above mentioned approach from the point of view of productivity can lead to undesired increases in the time for producing the shaped bodies. In the case of stereolithographic resins in the medicinal field and especially in the case of stereolithographic resins for the production of earpieces, colored or opaque stereolithographic resin formulations are especially relevant.

EXAMPLE 1

70.3—x weight percent bisphenol A-ethoxylate(4) dimethacrylate.
14.4 weight percent bisphenol-A-ethoxylate-(2)-dimethacrylate.
9.2 weight percent 7,7,9-(or 7,9,9)trimethyl-4,13-dioxo-3,14-dioxa-5,12-diaza-hexadecane-1,16-diol-dimethacrylate.
4.6 weight percent 1,4-butanedioldimethacrylate.
1.5 weight percent bis(2,4,6-trimethylbenzoyl)-phenylphosphinoxide.
X weight percent 2,2,6,6-tetramethylpiperdine-1-yloxy (free radical).
The 2,2,6,6-tetramethylpiperdine-1-yloxy (free radical) is used in concentrations of x=0; 0.005; 0.01; 0.02 and 0.05 weight percent.

EXAMPLE 2

70.3—x weight percent bisphenol-A-ethoxylate(4) dimethacrylate.
14.4 weight percent bisphenol-A-ethoxylate(2) dimethacrylate.
9.2 weight percent 7,7,9-(or 7,9,9)trimethyl-4,13-dioxo-3,14-dioxa-5,12-diaza-hexadecane-1,16-diol-dimethacrylate.
4.6 weight percent 1,4-butanedioldimethacrylate.
1.5 weight percent bis(2,4,6-trimethylbenzoyl)-phenylphosphinoxide.
X weight percent 2,2,6,6-tetramethylpiperdine-1-yloxy (free radical).
The inhibitor hydromethylether was used in concentrations of x=0; 0.1; 0.2; 0.4; 0.6; 1; and 2 weight percent.

FIG. 1: The influence of the concentration of 2,2,6,6-tetramethylpiperdine-1-yloxy on the laser penetration depth Dp of the resin formulations of Example 1.
FIG. 2: The influence of the concentration of 2,2,6,6-tetramethylpiperdine-1-yloxy on the critical energy of the resin formulations of Example 1.
FIG. 3: The influence of the concentration of hydroquinonemonomethylether on the laser penetration Dp of the resin formulation of Example 2.
FIG. 4: The influence of the concentration of hydroquinonemonomethylether on the critical energy of the resin formulations of Example 2.

The mixtures of the invention can, if required, have other additives supplied to them, for example flow agents, UV stabilizers, wetting agents, fillers, coloring agents and pigments. In the sense of the invention, especially suitable coloring agents are anthroquinone diestuff preparations like those marketed for example by Bayer under the name Macrolex.

Use Examples:

EXAMPLE 3

A Yellowish Opaque Stereolithographic Resin
66.69% bisphenol-A-ethoxylate(4)dimethacrylate 15.6 weight percent bisphenol-A-ethoxylate-(2)-dimethacrylate.
10 weight percent 7,7,9-(or 7,9,9)-trimethyl-4,13-dioxo-3,14-dioxa-5,12-diaza-hexadecane-1,16-diol-dimethacrylate.
5 weight percent 1,4-butanedioldimethacrylate.

1.5 weight percent bis(2,4,6-trimethylbenzoyl)-phenylphosphinoxide.

0.8 weight percent pyrogenic silica.

0.2 weight percent iron oxide pigment.

0.01 weight percent 2,2,6,6-tetramethyl piperdine-1-yloxy (free radical).

EXAMPLE 4

A Blue Transparent Stereolithographic Resin
69.035% bisphenol A-oxylate(4)dimethacrylate 15.6 weight percent bisphenol A ethacrlyate(2) dimethacrylate.

10 weight percent 7,7,9- (or 7,9,9)trimethyl-4,13-dioxo-3,14-dioxa-5,12-diaza-hexa decane-1,16-diol-dimethacrylate.

3.8 weight percent 1,4-butane diol dimethacrylate.

1.5 weight percent bis(2,4,6-trimethylbenzoyl)-phenylphosphinoxide.

0.3 weight percent anthroquinone dyepreparation (containing CI solvent blue 97).

0.025 weight percent UV stabilizer.

0.01 weight percent 2,2,6,6-tetramethylpiperdine-1-yloxy (free radical).

EXAMPLE 5

A Red Transparent Stereolithographic Resin
69.055% bisphenol-A-ethoxylate(4)dimethacrylate 15.6 weight percent bisphenol-A-ethoxylate(2) dimethacrylate.

10 weight percent 7,7,9-(or 7,9,9)trimethyl-4,13-dioxo-3,14-dioxa-5,12-diaza-hexadecane-1,16-diol-dimethacrylate.

3.8 weight percent 1,4-butanedioldimethacrylate.

1.5 weight percent bis(2,4,6-trimethylbenzoyl)-phenylphosphinoxide.

0.8 weight percent pyrogenic silica.

0.2 weight percent iron oxide pigment.

0.01 weight percent 2,2,6,6-tetramethylpiperdine-1-yloxy (free radical).

The relevant parameters for the use of the above mentioned resins in stereolithography are collected in Table 1. All viscosity measurements were carried out at 23° C. with a CVO 120 rheometer of Bohlin Instruments. The determination of the bend strength, the modulus of elasticity and the elongation were carried out in accordance with EN ISO 178 (1996) with a Zwick 1—test machine of the Zwick firm. For the determination of the Ec and Dp values by means of the above mentioned window pane method, the average value from 10 window pane sample bodies was determined. The sample bodies were produced with a Viper $Si^2$ SLA apparatus equipped with an $ND:YVO_4$ solid body laser. The green bodies were after hardened with a stroboscope lighting unit Sonolux PR from Innovation Meditech by means of 4000 flashes.

With the hardened sample bodies of the stereolithographic formulations from Examples 3 to 5, studies were made of the cyclotoxic, irritation and allergic reaction or sensitivity potential of the formulations.

The determination of the irritating effect was carried out based upon ISO 10993-10 (2002), ISO 10993-12 (2002) and ISO 17025 (1999) tests on white New Zealand rabbits. These were injected with control solutions and test extracts from the sample bodies intracutaneously. From the tests the above mentioned stereolithographic formulations were found to be negligibly irritating. In a further test series for determining the biological reaction of the mamalian cell culture (L929) to the sample bodies, elution tests according to ISO 1099-35 (1999), ISO 10993-12 (2002) and ISO 17025 (1999) were carried out. No biological reactivity (0°) was found with the L929 mamalian cells. Correspondingly, the above mentioned materials were nonocytotoxic and satisfied the requirements of ISO 1099-395.

In addition, the allergic potential and the sensitization characteristics of the sample bodies were evaluated in a test series on the basis of ISO 10993-10 (2002) and ISO 1093-12 (2002) in accordance with F. N. Marzulli and H. I. Maibach (eds.), $5^{th}$ ed., 1996, pages 403, 440-441, Hemisphere Publishing Corporation, New York, B. Magnusson and A. M. Kligman, J. Invest. Dermatol. 52:268-176 (1969); B. Magnusson and A. M. Kligman, 1970, Allergic Contact Dermatitis in the Guinea Pig, Identification of Contact Allergens, Springfield, Ill., Thomas. The above mentioned stereolithographic formulations induced no biological reaction (0° sensitisation. In accordance with the Kligman scale there was a reaction of the first degree so that the allergizing potential of the stereolithographic formulation is considered to be weak utilizing the standard staging. A sensitization rate of the first degree in accordance with Magnusson and Kligman is considered as not significant.

From these results, it is clear that the stereolithographic formulations according to the invention can be used in medicinal technology, especially for the production of ear pieces.

In Table 3 the mechanical and chemical parameters of the commercially available opaque stereolithographic resin (7,7, LS7410) of the Vantico Firm, which was conceived for use in medicinal technology, have been given. From the tables, one can see that by comparison to the formulation according to the invention, there is advantageously a significantly reduced viscosity and higher Dp value. In addition, the mechanical properties of bending strength and modulus of elasticity of the prior art of the disclosed formulation are significantly above the values for the commercially available produced. In addition, it can be seen that the Vantico material cannot be treated as in the cytotoxic stage but in a test series for determining cytotoxicity a slight biological reaction of the first degree can be induced. From the point of view of use in the field of medicinal technology, this is not the case with the formulations according to the invention.

All of the serial lithographic resin formulations according to the invention in Examples 3 to 5 have, from the point of view of production technology, an ideal viscosity, 2250 mpa s and green strength.

The conventional technique for producing earpieces based upon auto polymerizing or light hardening materials require shaping the earpiece in a negative mold. By comparison to the materials used conventionally for producing the earpieces (for example Fotoplast® of the Dreve Otoplsatic GmbH Firm (see Table 3) the mechanical values of bending strength and elastic modulus of the completely hardened molded bodies are significantly higher.

TABLE 1

Parameters of the Stereolithographic Resin Formulations of Examples 3 to 5

| Property | Composition Ex. 3 | Composition Ex. 4 | Composition Ex. 5 |
|---|---|---|---|
| Viscosity at 23° C., Mpa s | 700 | 860 | 820 |
| E-Modulus-Green, N mm$^{-2}$ | 1544 | 750 | 862 |
| Bending Strength Green, N mm$^{-2}$ | 81 | 48 | 51 |
| Elongation Green, % | 14 | 14 | 15 |
| E-Modulus hardened shaped body, N mm$^{-2}$ | | | |
| Bending strength of hardened shaped body, N mm$^{-2}$ | 120 | 115 | 98 |
| Elongation of hardened shaped body, % | 8 | 8 | 9 |
| Ec, mJ cm$^{-2}$ | 14.4 | 23.4 | 32.1 |
| Dp, mils | 4.1 | 4.3 | 5.6 |

TABLE 2

Data as to Commercially Available Stereolithographic Resin of the Firm Vantico

| Property | Vantico Stereolithographic Resin |
|---|---|
| Viscosity at 23° C., Mpa s | 2350 |
| Elastic Modulus of hardened shaped body, N mm$^{-2}$ | 1612 |
| Bending strength of hardened shaped body, N, mm$^{-2}$ | 81 |
| Elongation of hardened shaped body. % | 12 |
| Ec, mJ cm$^{-2}$ | 3.4 |
| Dp, mils | 6.6 |

TABLE 3

Mechanical values of commercially available products for the production of earpieces

| Material | E-modulus, N mm$^4$ | Bending strength | Elongation to Break |
|---|---|---|---|
| Fotoplast S/IO Blue transparent, Lot. 201504 | 1513 | 81 | 10 |
| Fotoplast S/IO Red transparent, Lot. 301531 | 1527 | 84 | 13 |
| Fotoplast S/IO Colorless transparent, Lot. 203523 | 1602 | 88 | 11 |
| Fotoplast S/IO Brown transparent, Lot. 209540 | 1374 | 74 | 14 |

The invention claimed is:

1. A biocompatible, low viscosity, radiation curable formulation comprising:
   a) 55 to 95 weight percent of a monomeric or oligomeric dimethacrylate of bisphenol-A or bisphenol-F;
   b) 0 to 20 weight percent of a urethane methacrylate with a functionality n<4 and a viscosity <15 Pa s;
   c) 2 to 15 weight percent of a monomeric or aliphatic or cycloaliphatic dimethacrylate with a viscosity <5 Pa s;
   d) 0 to 15 weight percent of a monofunctional methacrylate with a viscosity <3 Pa s;
   e) 0.5 to 6 weight percent of one or a combination of photoinitiators effective to form free radicals;
   f) 0.001 to 2 weight percent of the free radical inhibitor 2,2,6,6-tetramethylpiperdine-1-yloxy which can be present in combination with known inhibitors;
   g) 0 to 40 weight percent of fillers;
   h) 0 to 5 weight percent of color pigments; and
   i) 0 to 5 weight percent of usual additives like UV stabilizers or flow additives.

2. The formulation according to claim 1 comprising:
   a) 60 to 90 weight percent of ethoxylated bisphenol-A-dimethacrylate with a degree of ethoxylation of n<10 or a mixture of ethoxylated bisphenol-A-dimethacrylate with a degree of ethoxylation of n<10;
   b) 5 to 17 weight percent of an aliphatic or cycloaliphatic urethane methacrylate with a functionality of n<4 and a viscosity of <10 Pa s;
   c) 3 to 10 weight percent of an aliphatic or cyclo-aliphatic urethane dimethacrylate with a viscosity <3 Pa s;
   d) 2 to 10 weight percent of a monofunctional methacrylate with a viscosity of <3 Pa s;
   e) 1 to 4 weight percent of one or a combination of a plurality of photoinitiators effective to form free radicals;
   f) 0.005 to 0.05 weight percent of the free radical inhibitor 2,2,6,6-tetramethylpiperdine-1-yloxy optionally in combination with known inhibitors;
   g) 0 to 20 weight percent of fillers;
   h) 0 to 5 weight percent of color pigments;
   i) 0.01 to 3 weight percent of conventional additives like UV stabilizers or flow additives.

* * * * *

UNITED STATES PATENT AND TRADEMARK OFFICE
CERTIFICATE OF CORRECTION

| | | |
|---|---|---|
| PATENT NO. | : 7,232,646 B2 | Page 1 of 1 |
| APPLICATION NO. | : 10/561651 | |
| DATED | : June 19, 2007 | |
| INVENTOR(S) | : Martin Klare et al. | |

It is certified that error appears in the above-identified patent and that said Letters Patent is hereby corrected as shown below:

On the Title Page, Item (75)
In the left column, lines 76 and 77, in the second and third inventors' address, the city spelled "Castor-Rauxel" incorrectly should read -- Castrop-Rauxel --

Signed and Sealed this

Seventh Day of August, 2007

JON W. DUDAS
*Director of the United States Patent and Trademark Office*